United States Patent
Mohanty

(10) Patent No.: US 10,256,140 B2
(45) Date of Patent: Apr. 9, 2019

(54) METHOD OF REDUCING OVERLAY ERROR IN VIA TO GRID PATTERNING

(71) Applicant: Tokyo Electron Limited, Minato-ku, Tokyo (JP)

(72) Inventor: Nihar Mohanty, Clifton Park, NY (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 15/788,277

(22) Filed: Oct. 19, 2017

(65) Prior Publication Data

US 2018/0114721 A1    Apr. 26, 2018

Related U.S. Application Data

(60) Provisional application No. 62/410,811, filed on Oct. 20, 2016.

(51) Int. Cl.
*H01L 21/768*     (2006.01)
*H01L 21/033*     (2006.01)
*H01L 21/311*     (2006.01)
*H01L 23/535*     (2006.01)

(52) U.S. Cl.
CPC .... *H01L 21/76816* (2013.01); *H01L 21/0332* (2013.01); *H01L 21/0337* (2013.01); *H01L 21/31144* (2013.01); *H01L 21/76897* (2013.01); *H01L 23/535* (2013.01)

(58) Field of Classification Search
CPC ......... H01L 21/76816; H01L 21/76897; H01L 21/0332; H01L 21/0337; H01L 21/31144
See application file for complete search history.

(56) References Cited

U.S. PATENT DOCUMENTS

| | | | |
|---|---|---|---|
| 9,373,582 B1 | 6/2016 | Feurprier et al. | |
| 9,508,560 B1 * | 11/2016 | Mignot | ............ H01L 21/31116 |
| 2009/0152645 A1 * | 6/2009 | Tran | .................... H01L 21/0337 |
| | | | 257/401 |
| 2012/0302057 A1 | 11/2012 | Arnold | |
| 2015/0155171 A1 | 6/2015 | Chang et al. | |
| 2015/0243518 A1 | 8/2015 | deVilliers | |
| 2017/0338116 A1 * | 11/2017 | deVilliers | ........... H01L 21/0332 |
| 2018/0061699 A1 * | 3/2018 | Pal | ...................... H01L 21/0332 |

FOREIGN PATENT DOCUMENTS

WO    2015-047321 A1    4/2015

OTHER PUBLICATIONS

PCT International Search Report for International application No. PCT/US2017/057366, dated Feb. 7, 2018, Korean Intellectual Property Office, Korea.

* cited by examiner

*Primary Examiner* — Duy Vu N Deo

(57) ABSTRACT

Techniques herein include a method of patterning a substrate that uses a self-alignment based process to align a via to odd and even trenches by using multiple different materials. Methods herein decompose or separate a via pattern into spacer side via and mandrel side via, and then sequentially access the spacer side and mandrel side respectively. With such a technique, overlay of via to grid is significantly improved. By using an additional memorization layer underneath a trench memorization layer and independently accessing the spacer side and mandrel side in the midst of a trench pattern, significant improvement in via alignment is achieved.

15 Claims, 6 Drawing Sheets

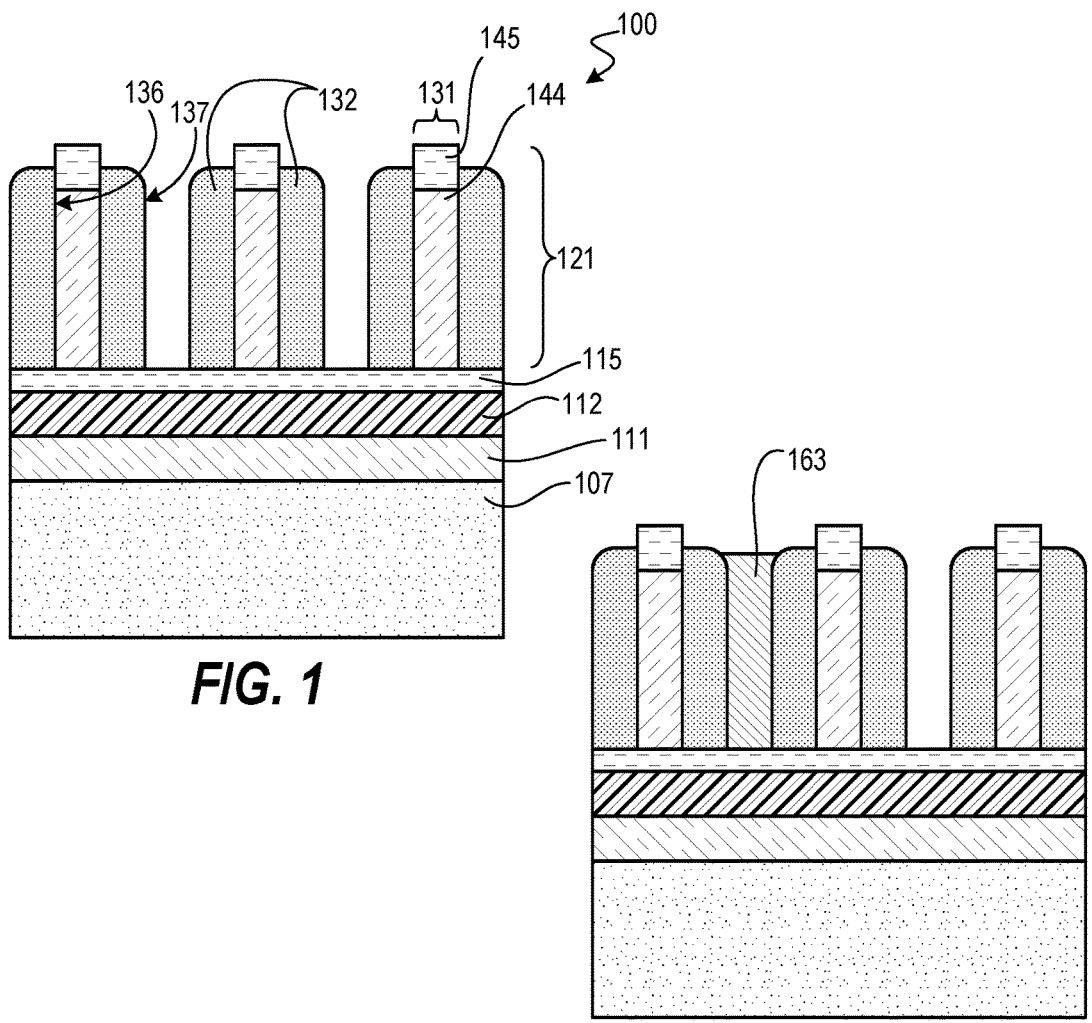

METHOD OF REDUCING OVERLAY ERROR IN VIA TO GRID PATTERNING

CROSS REFERENCE TO RELATED APPLICATIONS

The present application claims the benefit of U.S. Provisional Patent Application No. 62/410,811, filed on Oct. 20, 2016, entitled "Method of Reducing Overlay Error in Via to Grid Patterning," which is incorporated herein by reference in its entirety.

BACKGROUND OF THE INVENTION

This disclosure relates to semiconductor fabrication including processing of substrates such as semiconductor wafers.

SUMMARY

Semiconductor devices are continually being scaled down to fit more devices per unit area of a substrate. Techniques herein resolve an issue faced by via patterning, and this issue is via to grid overlay improvement. At advanced nodes when BEOL (back-end-of-line) trench patterning goes below 30 nm pitch, aligning the via mask between odd and even trenches becomes a challenge. Techniques herein use a self-alignment based process to align the via to odd and even trenches by using multiple different materials and memorization layers.

Techniques include a method of patterning a substrate. A first memorization layer is formed on a target layer of a substrate. A second memorization layer is formed on the first memorization layer. A multi-line layer is formed above the second memorization layer. The multi-line layer includes a region having a pattern of alternating lines of two or more differing materials. Each line has a horizontal thickness, a vertical height, and extends across the substrate. Each line of the pattern of alternating lines forms part of a top surface of the multi-line layer and vertically extends to a bottom surface of the multi-line layer. At least two of the two or more differing materials differ chemically from each other by having different etch resistivities relative to each other. A first etch mask is formed on the multi-line layer. A first etch process is executed that etches into the second memorization layer using the first etch mask and one or more materials of the multi-line layer as a first combined etch mask. A second etch mask is formed on the multi-line layer. A second etch process is executed that etches into the second memorization layer using the second etch mask and one or more materials of the multi-line layer as a second combined etch mask.

Of course, the order of discussion of the different steps as described herein has been presented for clarity sake. In general, these steps can be performed in any suitable order. Additionally, although each of the different features, techniques, configurations, etc. herein may be discussed in different places of this disclosure, it is intended that each of the concepts can be executed independently of each other or in combination with each other. Accordingly, the present invention can be embodied and viewed in many different ways.

Note that this summary section does not specify every embodiment and/or incrementally novel aspect of the present disclosure or claimed invention. Instead, this summary only provides a preliminary discussion of different embodiments and corresponding points of novelty over conventional techniques. For additional details and/or possible perspectives of the invention and embodiments, the reader is directed to the Detailed Description section and corresponding figures of the present disclosure as further discussed below.

BRIEF DESCRIPTION OF THE DRAWINGS

A more complete appreciation of various embodiments of the invention and many of the attendant advantages thereof will become readily apparent with reference to the following detailed description considered in conjunction with the accompanying drawings. The drawings are not necessarily to scale, with emphasis instead being placed upon illustrating the features, principles and concepts.

FIG. 1 is a cross-sectional schematic side view of an example substrate segment showing a process flow according to embodiments disclosed herein.

FIG. 2 is a cross-sectional schematic side view of an example substrate segment showing a process flow according to embodiments disclosed herein.

FIG. 3 is a cross-sectional schematic side view of an example substrate segment showing a process flow according to embodiments disclosed herein.

DETAILED DESCRIPTION

Figure 4:
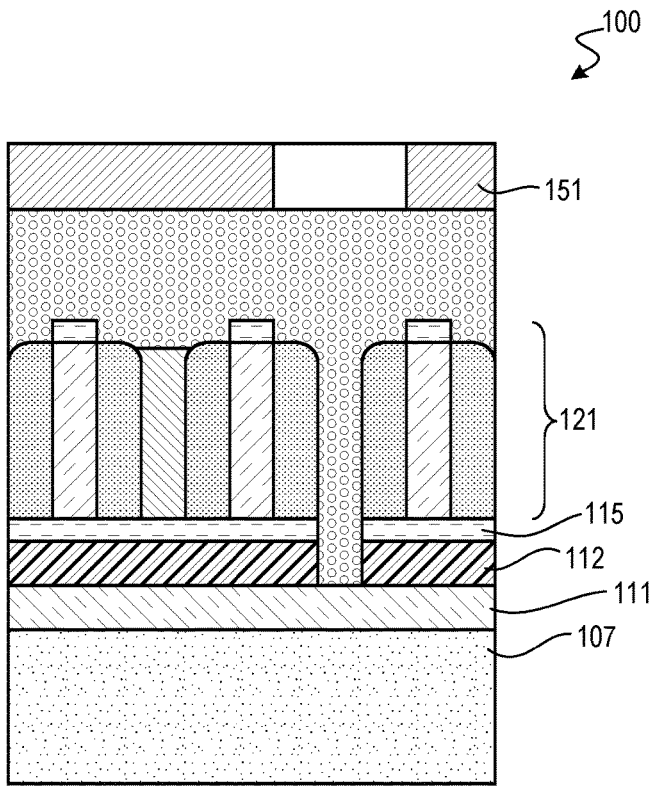
FIG. 4 is a cross-sectional schematic side view of an example substrate segment showing a process flow according to embodiments disclosed herein.

Techniques herein include a method of patterning a substrate that uses a self-alignment based process to align a via to odd and even trenches by using multiple different materials. Example embodiments can be applied to double patterning grids such as SAQP (self-aligned quadruple patterning) grid or SADP (self-aligned double patterning) grid as well as other patterning schemes. Methods herein decompose or separate a via pattern into spacer side via and mandrel side via, and then sequentially access the spacer side and mandrel side respectively. With such a technique, overlay of via to grid is significantly improved. By using an additional memorization layer underneath a trench memorization layer and independently accessing the spacer side and mandrel side in the midst of a trench pattern, significant improvement in via alignment is achieved.

Referring now to FIG. 1, a first memorization layer 111 is formed on a target layer 107 of a substrate 100. A second memorization layer 112 is formed on the first memorization layer 111. Various materials can be used. In one example the first memorization layer 111 can be silicon nitride for via memorization, while the second memorization layer 112 can be titanium nitride for trench memorization. An intermediate layer 115 can be formed on second memorization layer 112. Intermediate layer 115 is optional.

A multi-line layer 121 is formed above the second memorization layer 112. The multi-line layer 121 can be formed on the second memorization layer 112 or on the intermediate layer 115. The multi-line layer 121 includes a region having a pattern of alternating lines of two or more differing materials. Each line has a horizontal thickness, a vertical height, and extends across the substrate. Each line of the pattern of alternating lines forms part of a top surface of the multi-line layer 121 and vertically extends to a bottom surface of the multi-line layer 121. At least two of the two or more differing materials differ chemically from each other by having different etch resistivities relative to each other.

In some embodiments, the multi-line layer 121 comprises mandrels 131 and sidewall spacers 132 formed on sidewalls of the mandrels 131. The sidewall spacers 132 have a mandrel side 136 and a spacer side 137. The mandrel side 136 is in contact with a respective mandrel. The sidewall spacers defining open space between spacer sides of adjacent sidewall spacers. In other words, there is open space between spacer sides of adjacent sidewall spacers.

The pattern of alternating lines of two or more differing materials can include a repeating sequence of A-B-C-B-A-B-C-B in which material A and material B have different etch resistivities relative to each other. In one example, mandrels 131 can be material A, while sidewall spacers are material B. Material C can be a third material or can be open spaces as illustrated in the Figures.

In some embodiments, the mandrels can be formed as a composite of two materials having an upper mandrel layer 145 and a lower mandrel layer 144. The intermediate layer 115 and the upper mandrel layer 145 can be comprised of a same material. A vertical thickness of the upper mandrel layer 145 can be greater than a vertical thickness of the intermediate layer 115.

Referring now to FIG. 2, plug 163 (or multiple plugs) can be formed at predetermined locations within open spaces in multi-line layer 121. By way of a non-limiting example, such a plug can be formed by atomic layer deposition of titanium oxide. A plug mask can be used for deposition. Forming plugs is optional, but can be beneficial depending on materials selected for use and etch resistivities of those materials. Alternatively, a third line of material can be used in the multi-line layer 121.

An etch process can be executed that etches into second memorization layer 112 using the multi-line layer 121 (and any plugs) as an etch mask (FIG. 3). Having upper mandrel layer 145 thicker compared to intermediate layer 115 helps preserve mandrel caps while being able to etch through the intermediate layer 115.

Figure 5:
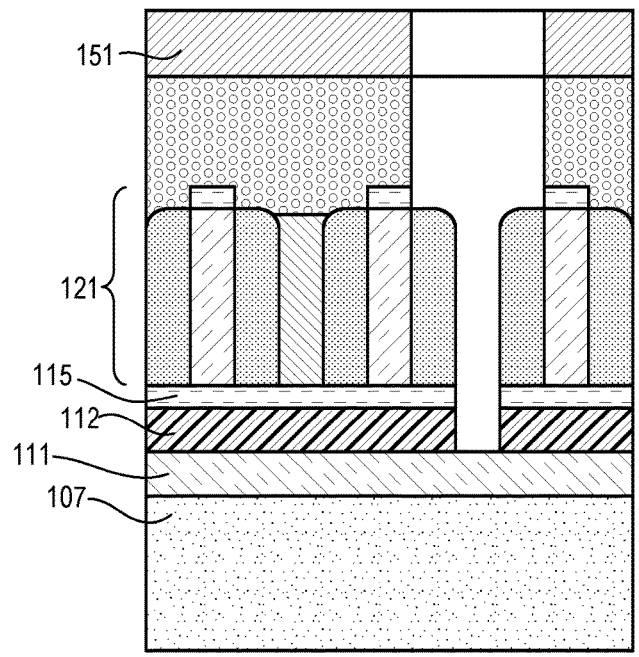
FIG. 5 is a cross-sectional schematic side view of an example substrate segment showing a process flow according to embodiments disclosed herein.
Figure 6:
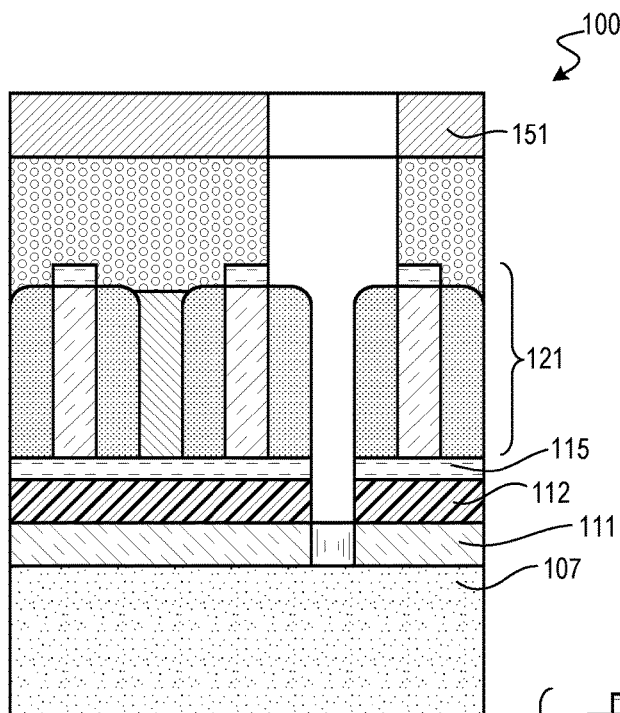
FIG. 6 is a cross-sectional schematic side view of an example substrate segment showing a process flow according to embodiments disclosed herein.

A first etch mask 151 is formed on the multi-line layer 121. FIGS. 4 and 5 illustrate an example result. A first etch process is executed that etches into the first memorization layer 111 using the first etch mask 151 and one or more materials of the multi-line layer 121 as a first combined etch mask (FIG. 6). In one example, the first etch mask can comprise slot openings for patterning vias.

Figure 7:
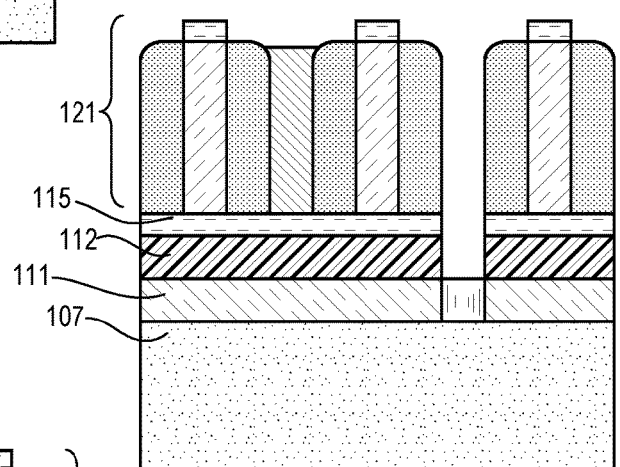
FIG. 7 is a cross-sectional schematic side view of an example substrate segment showing a process flow according to embodiments disclosed herein.
Figure 8:
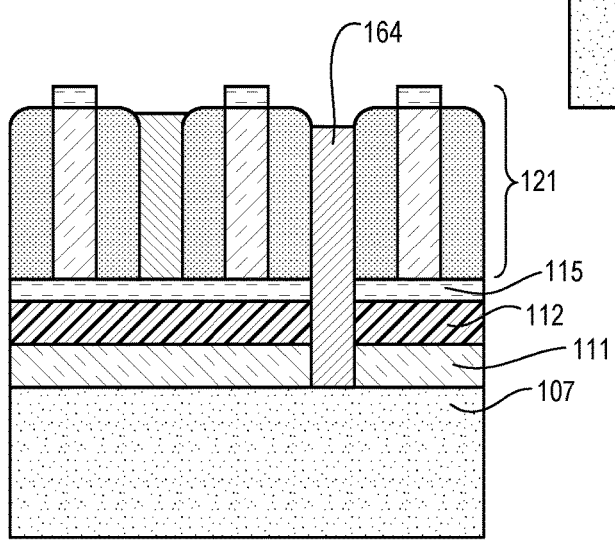
FIG. 8 is a cross-sectional schematic side view of an example substrate segment showing a process flow according to embodiments disclosed herein.

First etch mask 151 can then be removed (FIG. 7). Optionally, a plug 164 can be formed in openings created by the first etch process (FIG. 8). Such a plug can be, for example, zirconium oxide.

Figure 9:
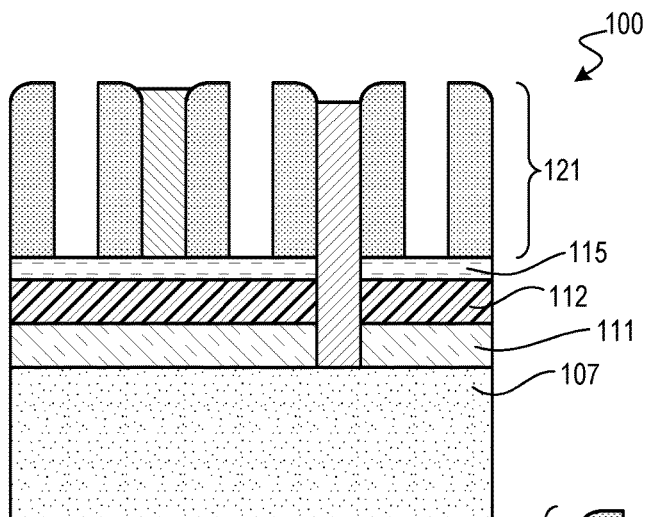
FIG. 9 is a cross-sectional schematic side view of an example substrate segment showing a process flow according to embodiments disclosed herein.
Figure 10:
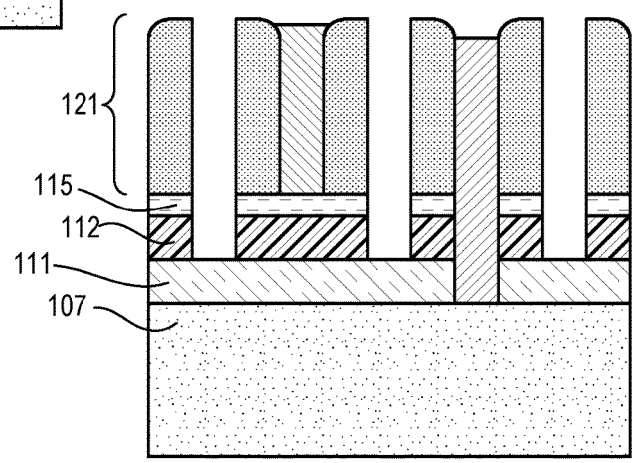
FIG. 10 is a cross-sectional schematic side view of an example substrate segment showing a process flow according to embodiments disclosed herein.

In FIG. 9, mandrels 131 are removed from the multi-line layer 121. In FIG. 10, an etch process is executed that etches the second memorization layer 112 using the remaining materials of the multi-line layer 121 as an etch mask.

Figure 11:
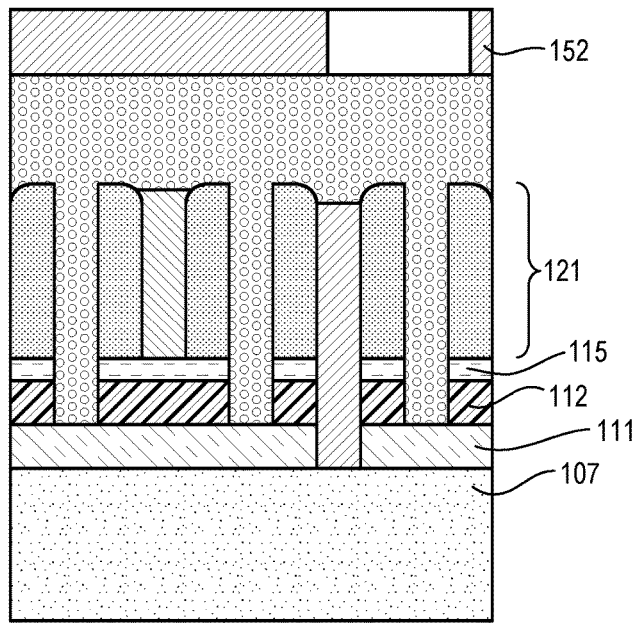
FIG. 11 is a cross-sectional schematic side view of an example substrate segment showing a process flow according to embodiments disclosed herein.
Figure 12:
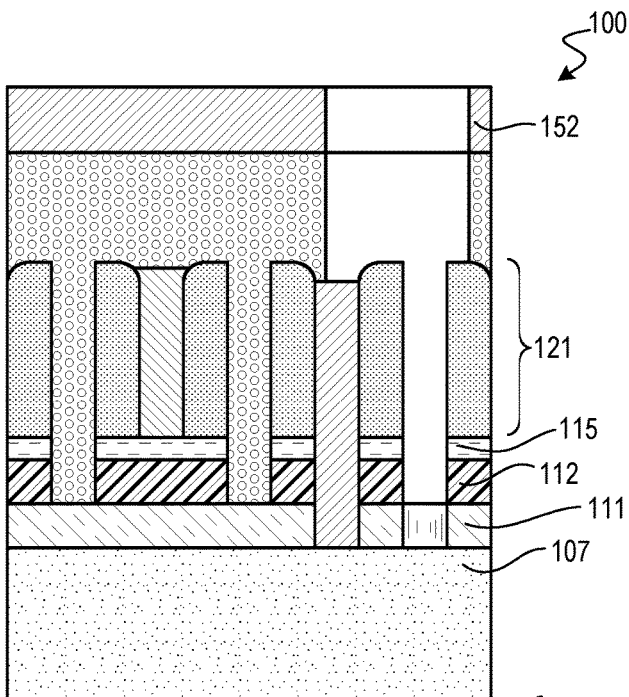
FIG. 12 is a cross-sectional schematic side view of an example substrate segment showing a process flow according to embodiments disclosed herein.

A second etch mask 152 is formed on the multi-line layer (FIG. 11). A second etch process is executed that etches into the first memorization layer 111 using the second etch mask 152 and one or more materials of the multi-line layer 121 as a second combined etch mask (FIG. 12). Note that one or more of the multi-line layer materials can be etched, or the multi-line layer can already have openings (especially when there are two lines of materials plus a space as compared to three or more lines of material) and so no etching of the one or more lines of the multi-line layer is needed. One or more lines can be etched in a previous step before any etch mask is formed, or etched after a given etch mask is formed.

Figure 13:
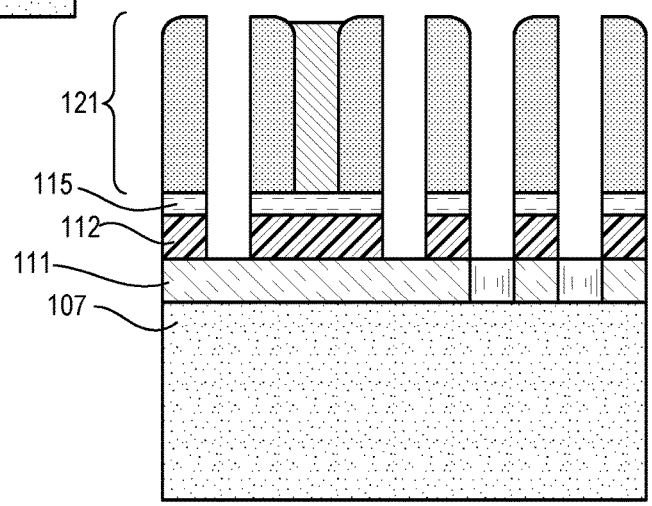
FIG. 13 is a cross-sectional schematic side view of an example substrate segment showing a process flow according to embodiments disclosed herein.
Figure 14:
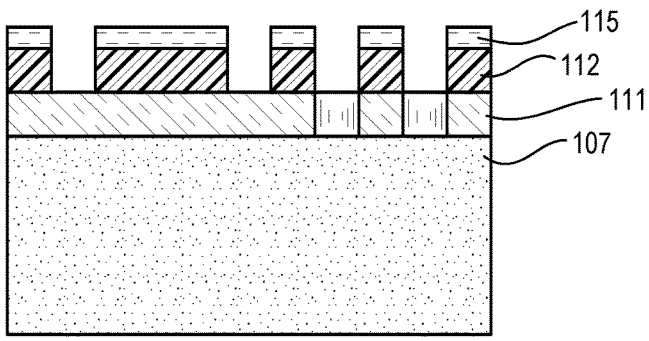
FIG. 14 is a cross-sectional schematic side view of an example substrate segment showing a process flow according to embodiments disclosed herein.
Figure 15:
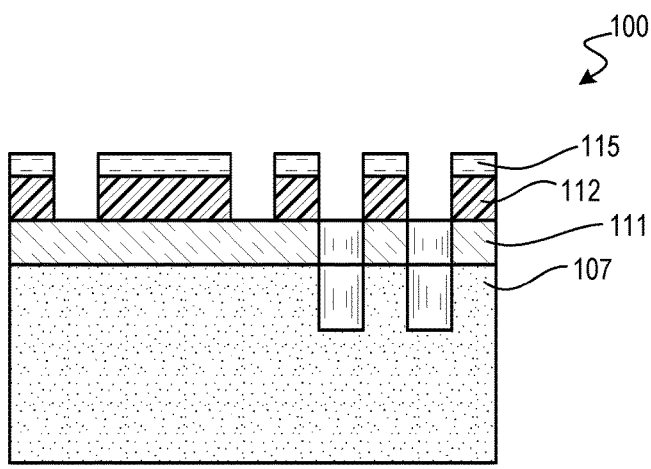
FIG. 15 is a cross-sectional schematic side view of an example substrate segment showing a process flow according to embodiments disclosed herein.
Figure 16:
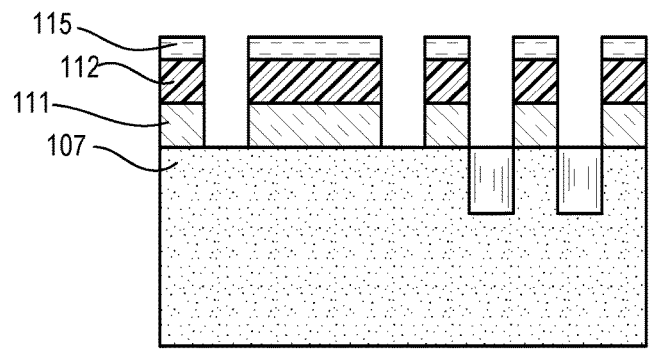
FIG. 16 is a cross-sectional schematic side view of an example substrate segment showing a process flow according to embodiments disclosed herein.
Figure 17:
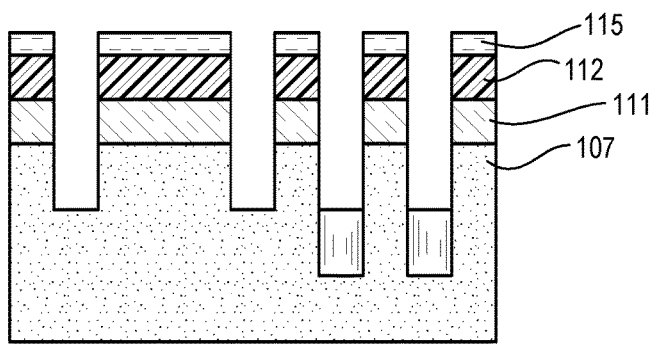
FIG. 17 is a cross-sectional schematic side view of an example substrate segment showing a process flow according to embodiments disclosed herein.

The first etch mask, the second etch mask, and the multi-line layer can all be removed (FIGS. 13 and 14). The first etch mask can be removed in a previous step depending on a desired process flow. The substrate now has patterns memorized in the first memorization layer 111 and the second memorization layer 112. An etch process is executed that transfers a first memorization layer pattern defined by the first memorization layer into the target layer (FIG. 15). Next, an etch process can be executed that transfers a second memorization layer pattern defined by the second memorization layer into the target layer (FIGS. 16 and 17). Note that with target layer 107 being of one material, when the second memorization layer pattern is transferred into the target layer 107, the features or openings already etched using the first memorization layer pattern will be etched deeper.

Figure 18:
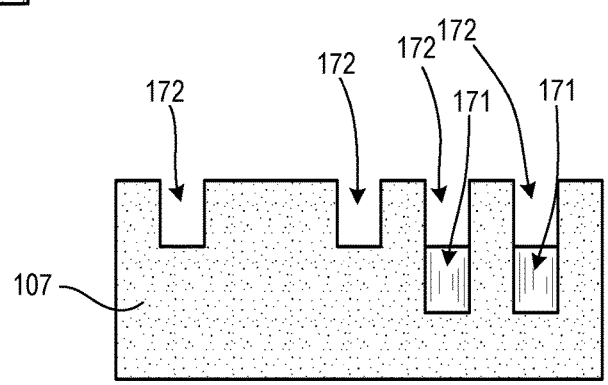
FIG. 18 is a cross-sectional schematic side view of an example substrate segment showing a process flow according to embodiments disclosed herein.

Accordingly, both vias and trenches can be etched into the target layer 107. FIG. 18 has memorization layers removed and has vias 171 as well as trenches 172 patterned into the target layer. Another advantage is that via openings can be patterning with slot opening and narrowed to a square or round opening by etch selectivity with the multi-line layer and dual memorization layers with a slot opening crossing perpendicular to lines of the multi-line layer. Such techniques can improve yield and reduce edge placement error. Note that various process flows can be used with the dual memorization layers under the multi-line layer. For example, either of the memorization layers can be patterned first or second. The memorization layers can be patterned at various stages using the multi-line layer and/or various etch masks. A result is that two patterns are memorized with self-alignment and can be used to accurately pattern trenches and vias for metallization.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "target substrate" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

Those skilled in the art will also understand that there can be many variations made to the operations of the techniques explained above while still achieving the same objectives of the invention. Such variations are intended to be covered by the scope of this disclosure. As such, the foregoing descriptions of embodiments of the invention are not intended to be limiting. Rather, any limitations to embodiments of the invention are presented in the following claims.

The invention claimed is:

1. A method of patterning a substrate, the method comprising:
forming a first memorization layer on a target layer of a substrate;
forming a second memorization layer on the first memorization layer;
forming a multi-line layer above the second memorization layer, the multi-line layer including a region having a pattern of alternating lines of two or more differing materials, wherein each line has a horizontal thickness, a vertical height, and extends across the substrate, wherein each line of the pattern of alternating lines forms part of a top surface of the multi-line layer and vertically extends to a bottom surface of the multi-line layer, wherein at least two of the two or more differing materials differ chemically from each other by having different etch resistivities relative to each other;
forming a first etch mask on the multi-line layer and executing a first etch process that etches into the first memorization layer using the first etch mask and one or more materials of the multi-line layer as a first combined etch mask;
subsequent to executing the first etch process, removing a specific material from the multi-line layer and transferring a pattern defined by the multi-line layer into the first memorization layer; and
subsequent to transferring the pattern defined by the multi-line later into the first memorization layer, forming a second etch mask on the multi-line layer and executing a second etch process that etches into the first memorization layer using the second etch mask and one or more materials of the multi-line layer as a second combined etch mask.

2. The method of claim 1, further comprising:
removing the first etch mask, the second etch mask, and the multi-line layer;
transferring a first memorization layer pattern defined by the first memorization layer into the target layer; and
transferring a second memorization layer pattern defined by the first memorization layer into the target layer.

3. The method of claim 2, wherein the target layer comprises dielectric material;
wherein the first memorization layer pattern defines vias; and
wherein the second memorization layer pattern defines trenches.

4. The method of claim 2, wherein the multi-line layer comprising mandrels and sidewall spacers formed on sidewalls of the mandrels, the sidewall spacers having a mandrel side and a spacer side with the mandrel side in contact with a respective mandrel, the sidewall spacers defining open space between spacer sides of adjacent sidewall spacers.

5. The method of claim 2, wherein the pattern of alternating lines of two or more differing materials includes a repeating sequence of A-B-C-B-A-B-C-B in which material A and material B have different etch resistivities relative to each other.

6. The method of claim 4, further comprising an intermediate layer between the second memorization layer and the multi-line layer.

7. The method of claim 6, wherein the mandrels are formed as a composite of two materials having an upper mandrel layer and a lower mandrel layer.

8. The method of claim 7, wherein the intermediate layer and the upper mandrel layer are comprised of a same material, and wherein a vertical thickness of the upper mandrel layer is greater than a vertical thickness of the intermediate layer.

9. The method of claim 4, further comprising:
prior to forming the first etch mask, forming plugs at predetermined locations within open spaces in the multi-line layer.

10. The method of claim 9, further comprising:
subsequent to executing the first etch process and prior to forming the second etch mask, forming plugs at uncovered locations within open spaces in the multi-line layer.

11. The method of claim 2, wherein the first etch mask is removed from the substrate prior to forming the second etch mask.

12. The method of claim 1, wherein executing the first etch process includes selectively removing uncovered portions of at least one of the two or more differing materials of the multi-line layer.

13. The method of claim 12, wherein the two or more differing materials include three or more differing materials, wherein selectively removing at least one of the two or more differing materials includes selectively removing two of the three or more differing materials resulting in corresponding portions of the target layer being uncovered.

14. The method of claim 1, wherein executing the second etch process includes selectively removing uncovered portions of at least one of the two or more differing materials of the multi-line layer.

15. The method of claim 1, further comprising:
prior to forming the first etch mask, transferring a pattern defined by the multi-line layer into the first memorization layer.

\* \* \* \* \*